United States Patent

Morishita

[11] Patent Number: 5,583,361
[45] Date of Patent: Dec. 10, 1996

[54] SEMICONDUCTOR DEVICE

[75] Inventor: Masakazu Morishita, Hiratsuka, Japan

[73] Assignee: Canon Kabushiki Kaisha, Tokyo, Japan

[21] Appl. No.: 347,842

[22] Filed: Dec. 1, 1994

Related U.S. Application Data

[63] Continuation of Ser. No. 851,306, Mar. 12, 1992, abandoned.

[30] Foreign Application Priority Data

Mar. 18, 1991 [JP] Japan ................... 3-052428

[51] Int. Cl.$^6$ ............ H01L 29/76; H01L 29/94; H01L 31/062; H01L 31/113
[52] U.S. Cl. ............ 257/345; 257/344; 257/386; 257/408
[58] Field of Search ............ 257/344, 345, 257/368, 386, 387, 401, 403, 408

[56] References Cited

U.S. PATENT DOCUMENTS

| | | | |
|---|---|---|---|
| 4,697,198 | 9/1987 | Komori et al. | 257/345 |
| 4,701,775 | 10/1987 | Cosentino et al. | 257/403 |
| 4,784,968 | 11/1988 | Komori et al. | 257/345 |
| 4,819,043 | 4/1989 | Yazawa et al. | 257/344 |
| 4,908,681 | 3/1990 | Nishida et al. | 257/345 |
| 4,914,492 | 4/1990 | Matsumoto | 257/345 |

FOREIGN PATENT DOCUMENTS

| | | | |
|---|---|---|---|
| 1-212471 | 8/1989 | Japan | 257/408 |

OTHER PUBLICATIONS

Proceedings of the 8th Confernece ((1976) International) on Solid State Devices, Tokyo, 1976; Japanese Journal of Applied Physics, Vol. 16 (1977) Supplement 16-1, pp. 179-183, "Grooved Gate MOSFET" by Nishimatsu et al.

*Primary Examiner*—Steven H. Loke
*Attorney, Agent, or Firm*—Fitzpatrick, Cella, Harper & Scinto

[57] ABSTRACT

A semiconductor device is provided with a semiconductor at least including a source and a drain of a conductive type with a high impurity concentration and a channel area of a second conductive type opposite to the first conductive type, positioned between the source and drain, an insulation layer covering at least the channel area, and a gate electrode of a conductive material positioned adjacent to the insulation layer. A pn junction is positioned below the insulated gate electrode. A depletion layer extending from the pn junction at least reaches the source and drain areas.

15 Claims, 7 Drawing Sheets

SEMICONDUCTOR DEVICE

This application is a continuation of application Ser. No. 07/851,306, filed Mar. 12, 1992, now abandoned.

BACKGROUND OF THE INVENTION

1. Field of the Invention

The present invention relates to a semiconductor device, and more particularly to a semiconductor device provided with a gate-insulated transistor.

2. Related Background Art

Conventional semiconductor devices based on Si substrate and involving MOS transistors are associated with a parasite capacitance in the source-drain pn junction, and this is an essential drawback. Although the SOI (silicon, or semiconductor on insulator) MOS transistor was invented to reduce this drawback, its commercial application has not progressed sufficiently, also from the standpoint of manufacturing cost, as the preparation of a semiconductor layer of satisfactory properties on the insulator is extremely difficult. In other words, it has not yet been developed to the practical level as a semiconductor device of a low cost, a low parasite capacitance and high-speed functioning characteristics.

SUMMARY OF THE INVENTION

In consideration of the foregoing, an object of the present invention is to provide a semiconductor device in which a thick depletion area is formed under the source and drain, thereby reducing the parasite capacitance and achieving a similar effect in a bulk semiconductor to that of the SOI device.

Another object of the present invention is to provide a semiconductor device enabling mass production and being manufactured at a low cost.

Still another object of the present invention is to provide a semiconductor device allowing the application of CMOS or BiCMOS technology, and being therefore provided with the advantages of the bulk semiconductor devices and the SOI devices.

DETAILED DESCRIPTION OF THE PREFERRED EMBODIMENTS

The semiconductor device of the present invention, capable of resolving the aforementioned drawbacks and attaining the above-mentioned objects, features an insulated gate transistor having at least source and drain areas of a first conductive type with a high impurity concentration, a channel area of a second conductive type opposite to said first conductive type, positioned between said source and drain, an insulation layer covering at least said channel area, and a gate electrode composed of a conductive material and positioned adjacent to said insulation layer, wherein a pn junction is provided below said insulated gate transistor and a depletion layer extending from said pn junction at least reaches said source and drain areas.

In the following, the present invention will be clarified in further details, with reference to the attached drawings.

EMBODIMENT 1

Figure 1:
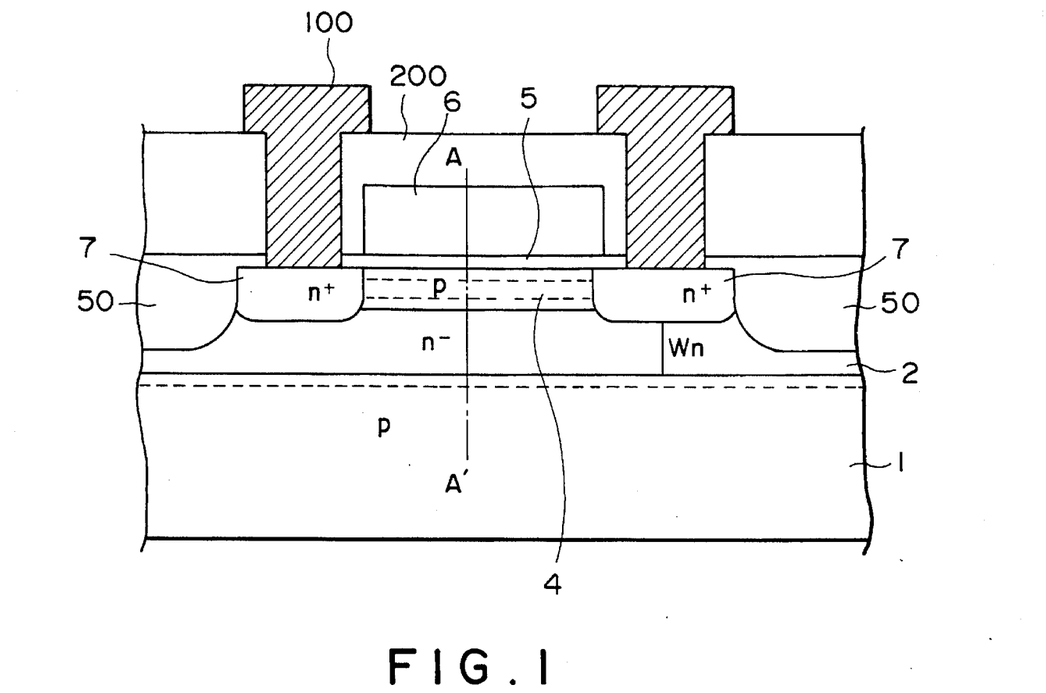
FIG. 1 is a schematic cross-sectional view of a semiconductor device of the present invention.

FIG. 1 is a schematic cross-sectional view 10 showing a MOS transistor in the semiconductor device of the present invention.

Referring to FIG. 1, an area 1 is composed of a p-semiconductor ( p-area ). Said p-area contains, for obtaining p-type conductivity, an element of the group III of the periodic table such as boron as an impurity, concentration of which is preferably within a range of $10^{15}$ –$10^{19}$ cm$^{-3}$.

An area 2 is composed of an n-semiconductor area (n$^-$-area ). Said n$^-$-area contains, for obtaining n$^-$type conductivity, an element of the group V of the periodic table such as phosphorus as an impurity, of which concentration is made lower than $10^{17}$ cm$^{-3}$ in order to facilitate the expansion of the depletion layer.

An area 4 is a channel area of p-type, the impurity concentration of which is made higher than that of the area 2, in order to suppress the extension of the depletion layer from the area 2. The concentration is preferably so designed that an inversion area is created within said p-area.

An area 5 is an insulation film constituting a gate film.

An area 6 constitutes a gate electrode, and can be composed of p$^+$- or n$^+$-polysilicon, silicide or a metal, particularly a high-melting metal, or a combination thereof.

Areas 7 are n$^+$-areas with an impurity concentration of $10^{18}$–$10^{21}$ cm$^{-3}$, constituting a source and a drain of the MOS transistor.

An area 200 is an insulation film for isolating wirings or layers. Areas 100 constitute ohmic electrodes and wirings for source and drain, and are composed, for example, of Al, Al-Si, Cu, poly-silicon or silicide.

Figure 2:
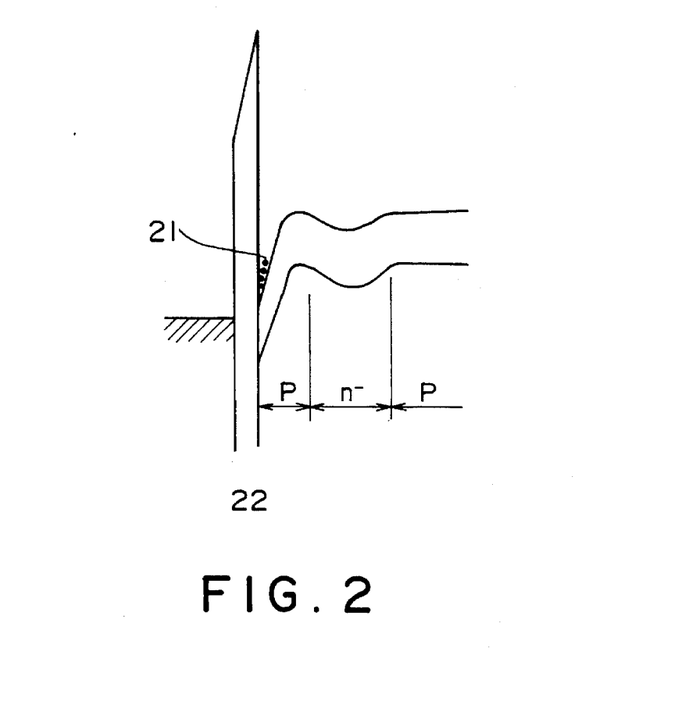
FIG. 2 is a view showing potential distribution along a line A-A' in FIG. 1.

FIG. 2 shows the potential distribution along a line A—A' in FIG. 1.

An inversion layer is formed in the vicinity of interface of the insulation film 22 of the area 4. The most important feature of the present invention is that a depletion layer, extending toward the area 2 from the junction of the areas 1, 2 reaches the areas 7 constituting the drain and source, thereby reducing the parasitic capacitance thereof. In FIG. 2, 21 indicates carriers.

The thickness of the depletion layer extending in the n-area 2 of the pn junction can be represented as:

$$X_n = \sqrt{\frac{2\varepsilon_S}{q} \cdot \frac{N_A}{N_D} \cdot \frac{V_{bi} + V_R}{(N_A + N_D)}} \quad (1)$$

wherein $V_{bi}$ is diffusion potential, $N_A$ and $N_D$ are concentrations of respectively p and n impurities, $\epsilon_s$ is dielectric constant, q is charge, and $V_R$ is applied voltage.

Figure 3:
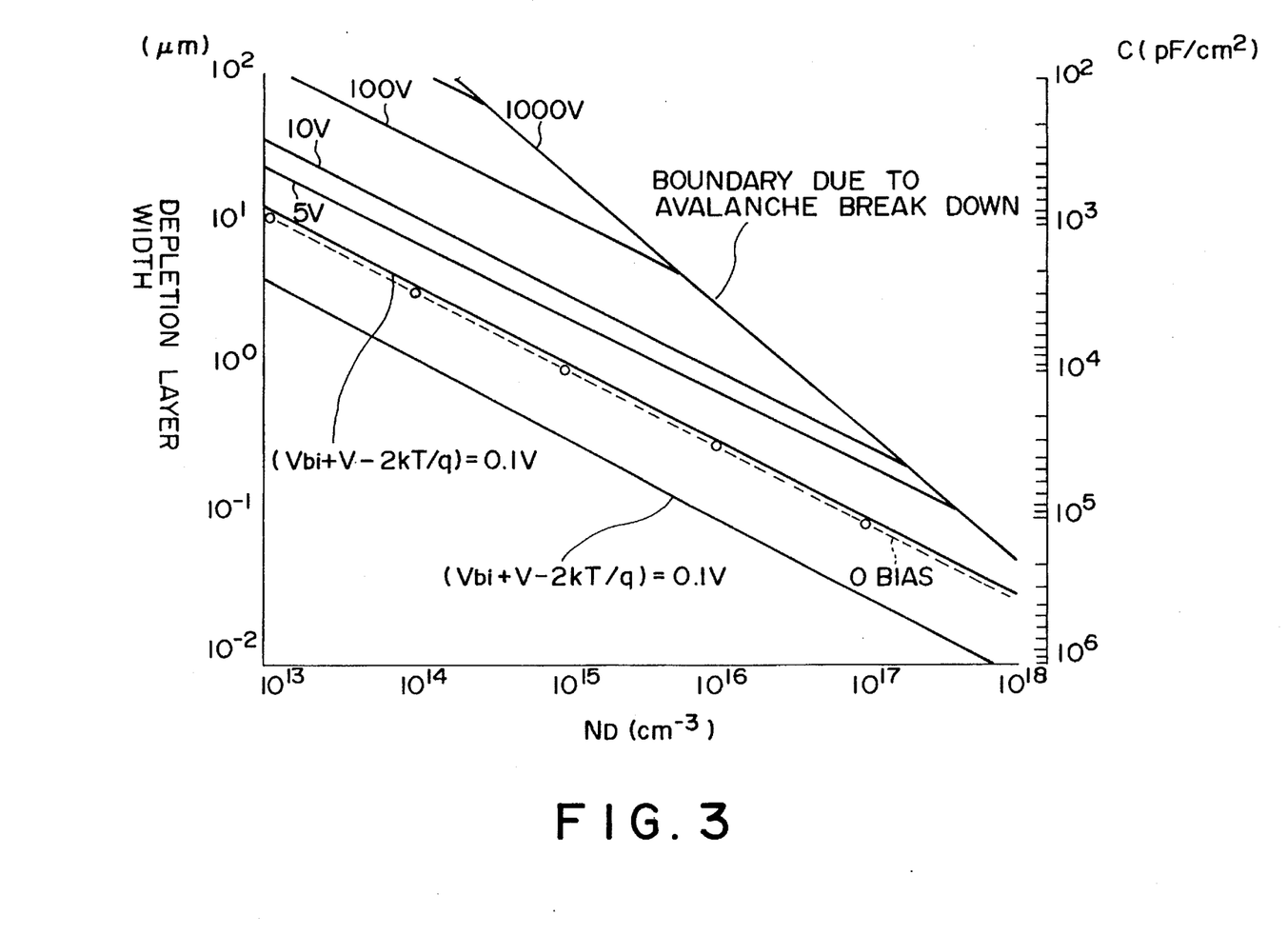
FIG. 3 is a chart showing the relationship between the thickness of depletion layer and $N_D$.

FIG. 3 shows the relationship between $N_D$ and thickness of depletion layer in case $N_A \gg N_D$.

In FIG. 3, a broken line indicates the zero bias state. Other lines indicate the thickness of depletion layer, as a function of total voltage including the applied voltage.

For example, in case of $N_D=10^{15}$ cm$^{-3}$, the thickness of the area 2 between the areas 7 and 1 for zero bias is selected not exceeding 1 μm. Also for a total voltage of 5 V, said thickness is selected not exceeding 2.5 μm. Thus, if the thickness $W_n$ of the area 2 is so selected as to satisfy:

$$W_N \leq x_n (N_D, V_R) \tag{2}$$

the area below the source and drain is covered by the depletion layer, so that the parasite capacitance is drastically reduced. Said effect of capacitance reduction becomes more enhanced as $N_D$ is lowered to $10^{14}$ or $10^{13}$ cm$^{-3}$.

The impurity concentration and thickness of the area 4 affect significantly the characteristics of the MOS transistor.

For the p-impurity concentration $N_{A3}$ in the area 4, the maximum width Wm of the depletion layer in the inversion layer is represented by:

$$Wm \approx \sqrt{\frac{4\epsilon_s kT \cdot \ln(N_{A3}/n_i)}{q^2 N_{A3}}} \tag{3}$$

wherein $n_i$ is true carrier concentration, K is Boltz-mann constant, and T is absolute temperature.

Figure 4:
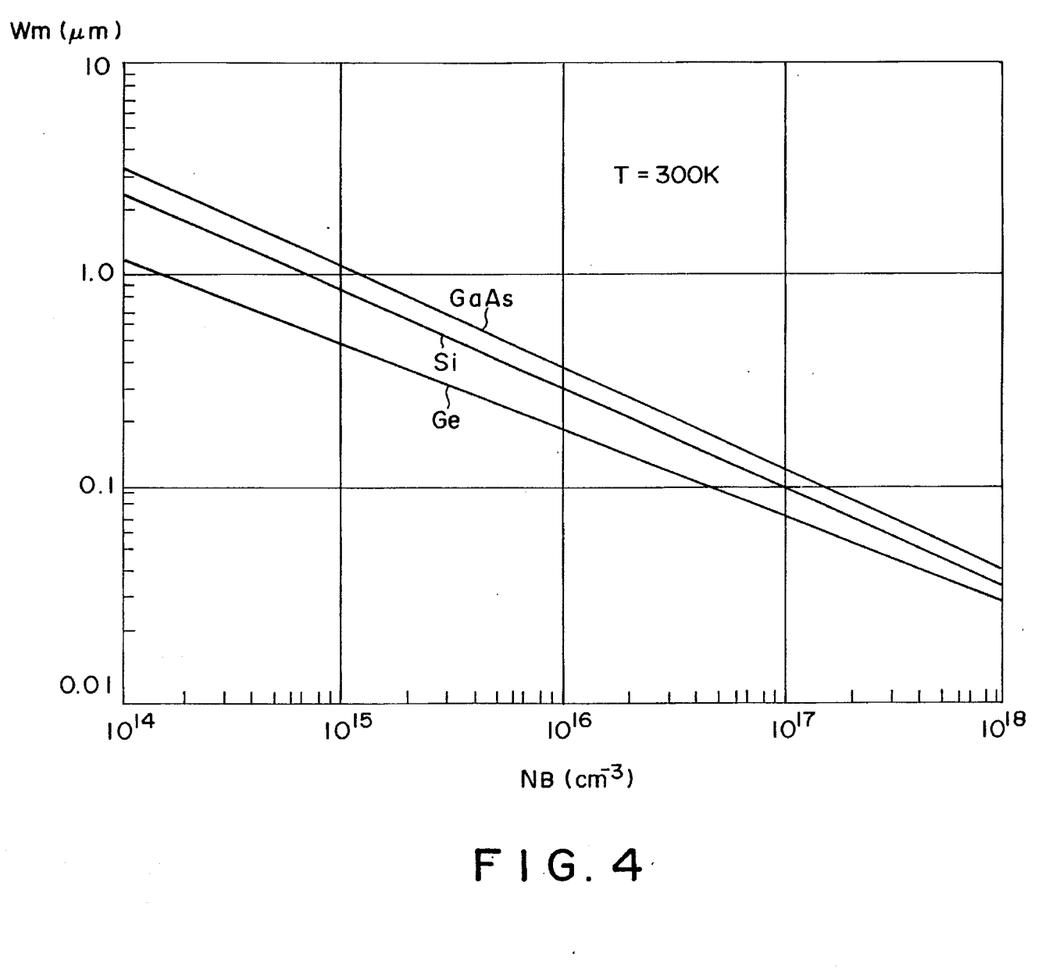
FIG. 4 is a chart showing the relationship between $N_B$ (cm$^{-3}$) and Wm.

FIG. 4 shows the relationship between $N_{A3}$ and Wm.

In case the thickness of the area 4 is larger than Wm indicated by the equation (3), the threshold voltage can be substantially determined by $N_{A3}$. However the threshold voltage becomes lower if said thickness is smaller than Wm. Also the capacitance below the gate is reduced if the depletion layer from the interface is continuous.

Consequently the S value ($S \equiv dV_G/d\log I_D$) at the threshold voltage or lower also becomes small.

In the structure shown in FIG. 1, the area 4 is preferably formed shallower than at least the area 7. It is essential that p-area is absent below the area 7.

In the following there will be explained an example of the process for producing the semiconductor device shown in FIG. 1.

At first a p-semiconductor substrate (impurity concentration $10^{15}$–$10^{19}$ cm$^{-3}$) or a p-area is prepared for example by a diffusion method, and an n-area is formed thereon, with a thickness of 2–10 μm and an impurity concentration of $10^{15}$ cm$^{-3}$ or lower by epitaxial growth.

Then the isolation area 50 is formed for example by selective oxidation.

Subsequently the gate oxide film or insulation layer 5 is prepared, and the area 4 is formed by ion implantation of B$^+$ with an acceleration voltage of 5–10 keV and with a dose of 1E11–1E14 cm$^{-2}$, followed by heat treatment.

Then p$^+$polysilicon is deposited and patterned to form the gate electrode areas 6.

Subsequently effected is ion implantation of n-impurity such as phosphorus or arsenic by a self alignment method utilizing said gate electrodes as the mask, and heat treatment is applied to form the areas 7.

Then an insulation film 200 for inter-layer separation and wiring separation is deposited and annealed, and contact holes are opened in the insulation layer 5 and the insulation film 200.

The semiconductor device of the present embodiment is obtained by depositing a metal layer for example by sputtering, followed by patterning, to obtain electrodes 100. As explained above, the semiconductor device of the present invention does not require a special step but can be prepared by the conventionally accumulated technologies, so that it is extremely advantageous in terms of production yield and cost.

EMBODIMENT 2

Figure 5:
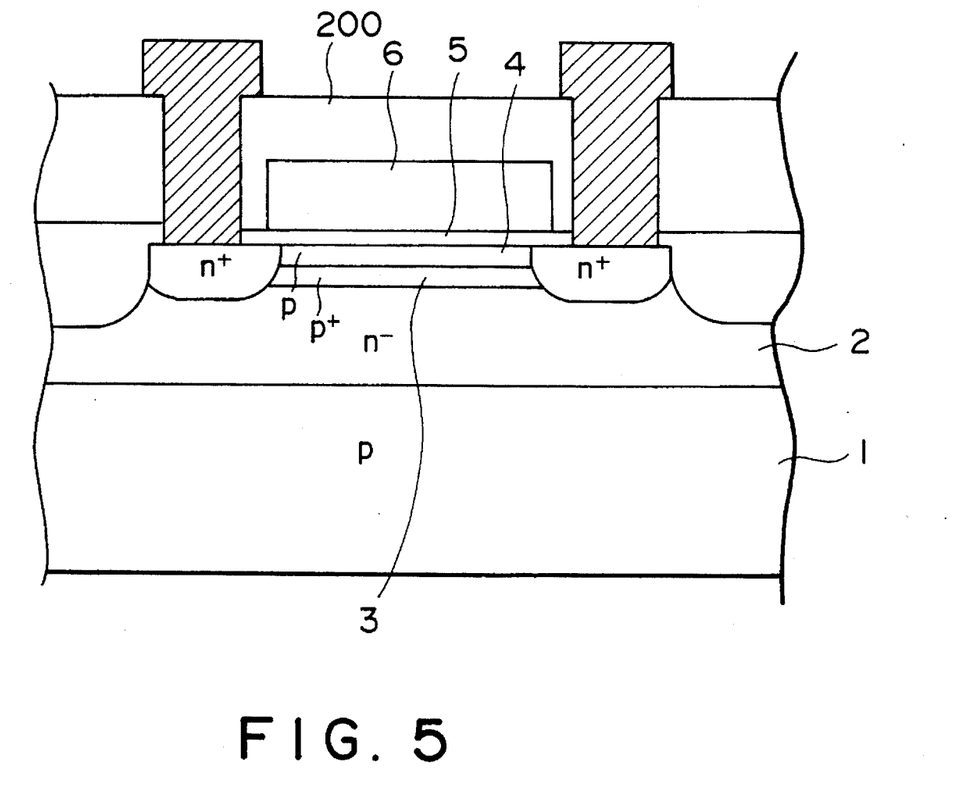
FIG. 5 is a schematic cross-sectional view of a semiconductor device of the embodiment 2 of the present invention.

FIG. 5 is a schematic cross-sectional view of a second embodiment of the present invention. This embodiment is basically different from the first embodiment in that an area 3 is provided between the areas 2 and 4. Said area 3 is opposite in conductive type to the area 2, same in conductive type as the area 4, and has a high impurity concentration (a p$^+$area in this example).

A reduction of the impurity concentration in the drift area of carriers in this manner allows to effectively reduce the ion scattering in the drift of induced carriers.

The mobility by ion scattering can be represented as:

$$\mu \alpha (m^*)^{1/2} N_i^{-1} T^{3/2} \tag{4}$$

wherein m* is effective mass, $N_i$ is impurity concentration, and T is absolute temperature. Thus the mobility can be increased by a reduction in $N_i$.

Figure 6:
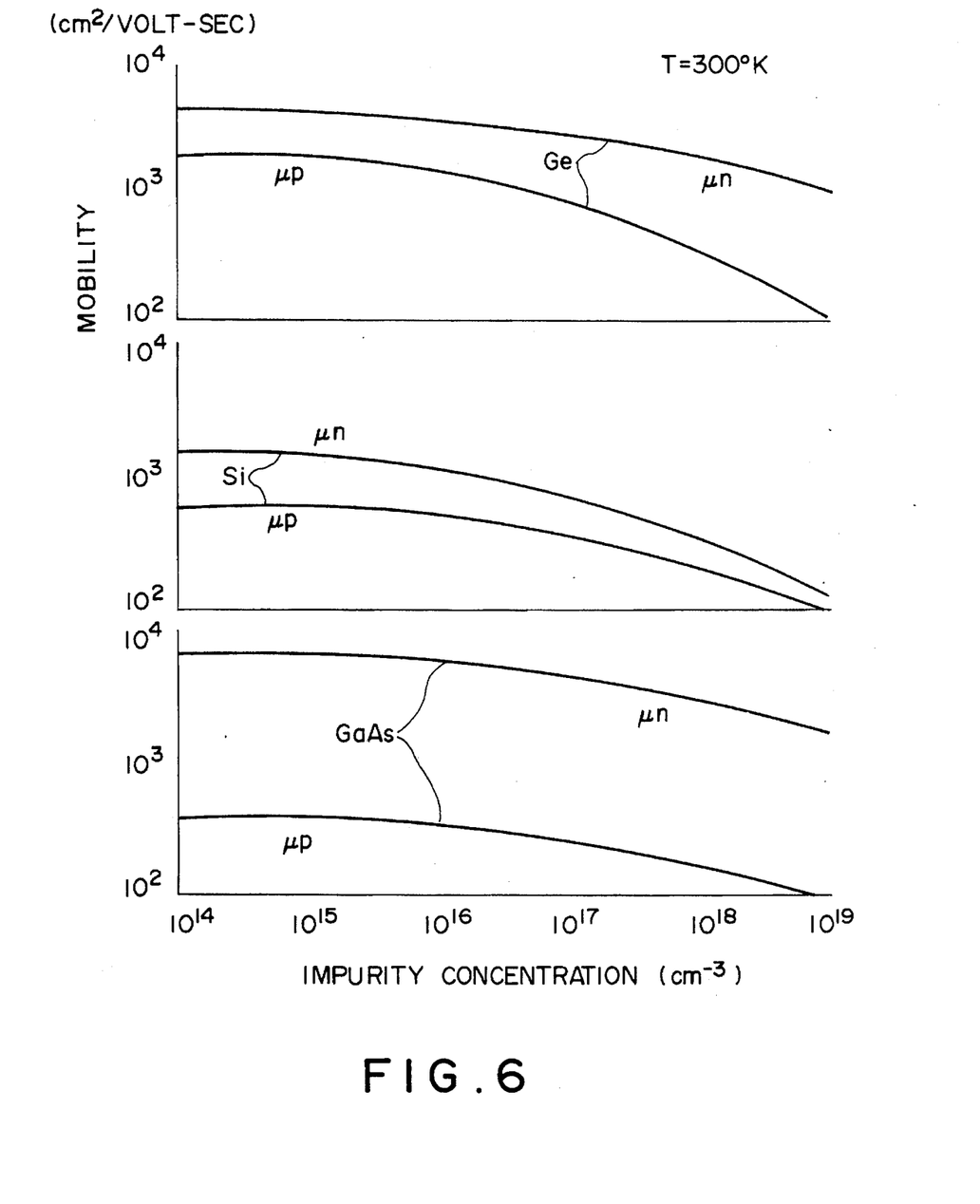
FIG. 6 is chart showing the relationship between impurity concentration and mobility.

FIG. 6 shows the change of mobility of carriers in various semiconductors, as a function of impurity concentration.

The mobility varies scarcely when the impurity concentration is equal to or less than $10^{16}$ cm$^{-3}$. The area 4 is preferably prepared by ion implantation, since the implanted ions are distributed with a certain peak in the direction of depth.

Figure 10:
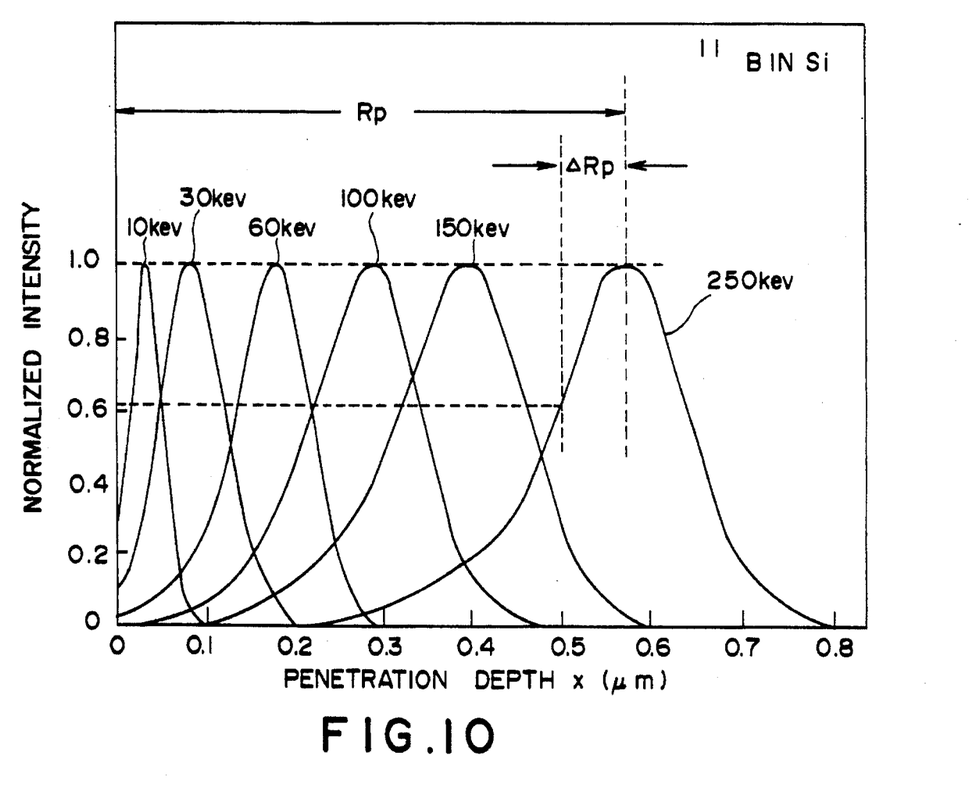
FIG. 10 is a chart showing the relationship between the penetration depth and the normalized intensity.

For example, in case of implanting $^{11}$B$^+$, there are obtained distributions as shown in FIG. 10, depending on the acceleration energy. As shown in FIG. 10, the boron concentration at the silicon surface is very low, though it is somewhat different according to the acceleration energy. Also it will be evident that the high concentration area of boron can be determined by suitable selection of the acceleration energy. In the present embodiment, the area 4 can be formed by activating the impurity by rapid thermal activation (RTA) for a short period (about 10 seconds) at a high temperature (900°–1000° C.) so as not to disturb the distribution.

EMBODIMENT 3

Figure 7:
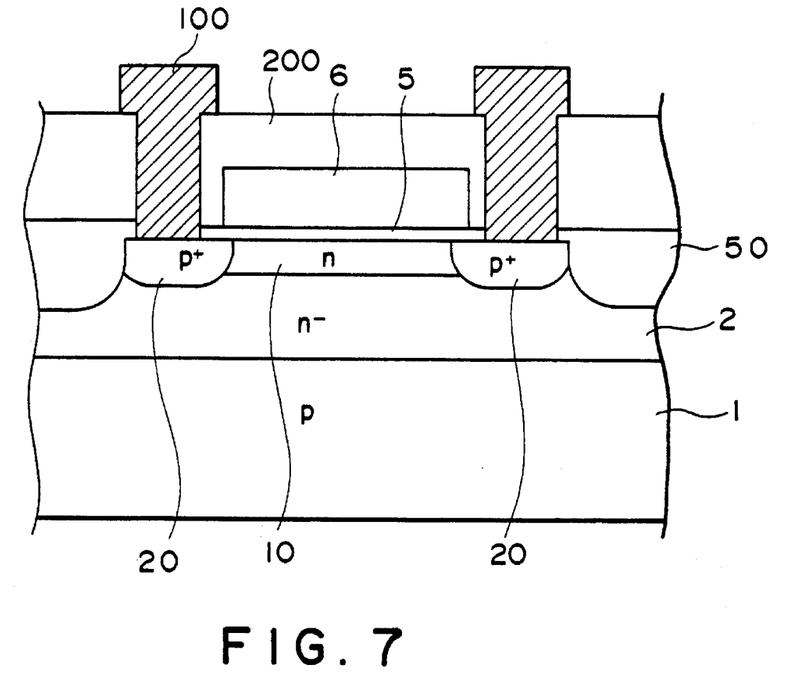
FIG. 7 is a schematic cross-sectional view of a semiconductor device of the embodiment 3 of the present invention.

FIG. 7 is a schematic cross-sectional view of a third embodiment, wherein a PMOS transistor is formed on the areas 1 and 2. It has to be so designed, as in the embodiment 1 shown in FIG. 1, that the area 2 is sufficiently depleted, and that the depleted area of the n$^-$area 2 has a sufficiently high depletion resistance in order to avoid current leakage between the areas 20 and 2.

This structure allows obtaining a CMOS structure with very simple steps.

Naturally the CMOS structure can also be attained by inverting the conductive types in the embodiments shown in FIGS. 1 and 5, but the number of steps becomes larger in comparison with the third embodiment. The well areas and buried areas can be increased according to the necessity. A bipolar transistor can naturally be easily prepared by forming buried areas, so that the present embodiment is easily applicable to a BiCMOS circuit.

EMBODIMENT 4

Figure 8:
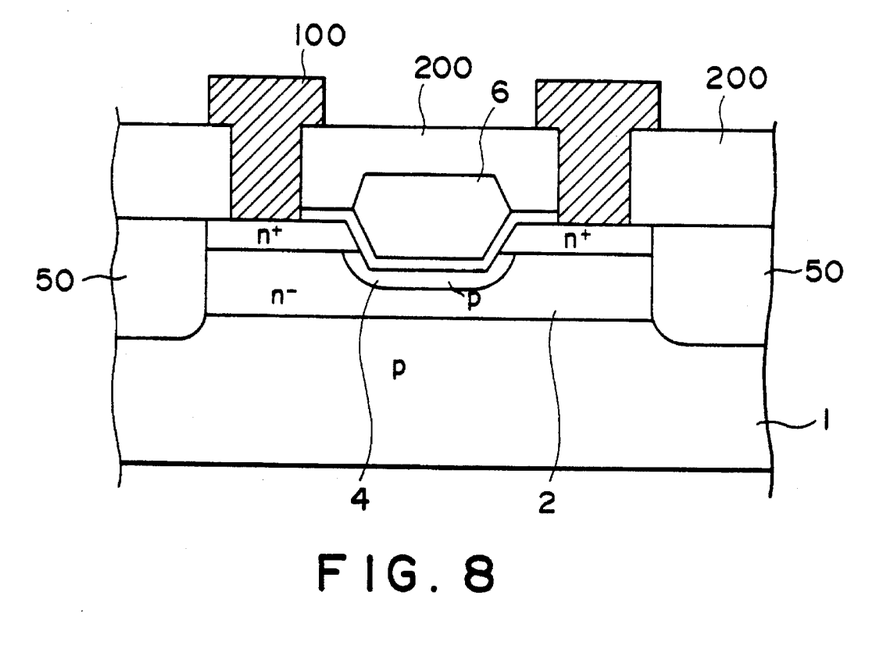
FIG. 8 is a schematic cross-sectional view of a semiconductor device of the embodiment 4 of the present invention.

FIG. 8 is a schematic cross-sectional view of a 4th embodiment. The present embodiment involves a recessed MOS transistor, allowing realization of a shorter channel, thereby achieving a finer pattern.

EMBODIMENT 5

Figure 9:
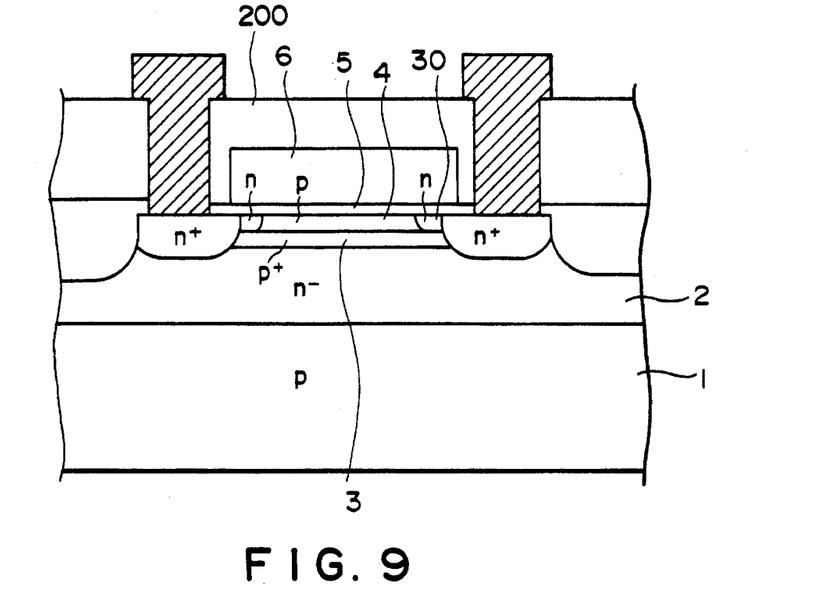
FIG. 9 is a schematic cross-sectional view of a semiconductor device of the embodiment 5 of the present invention.

FIG. 9 is a schematic cross-sectional view of a 5th embodiment, applied to an LDD structure, having a lower impurity concentration than in the drain and applying an electric field at the drain side. Also in this case there is provided a semiconductor device with reduced parasitic capacitance and with excellent high-speed characteristics.

Also in this embodiment, a PMOS structure may be obtained instead of an NMOS structure by inverting the conductive types, as already explained before. Also silicon may be replaced by another semiconductor material, such as silicon-germanium, germanium, gallium arsenide etc.

As explained in the foregoing, the present invention provides a semiconductor device which is featured by facts that:

1) formation of a thick depletion area below the source and drain areas reduces the parasite capacitance whereby an effect similar to that of SOI device can be obtained also in bulk semiconductor;

2) it is mass producible without any special steps and is therefore advantageous in terms of production yield and cost; and 3) it is applicable to CMOS or BiCMOS structure and has the advantages of both the bulk semiconductor and the SOI technology.

What is claimed is:

1. A semiconductor device comprising:

a semiconductor including at least a source and a drain of a first conductivity type with a high impurity concentration, a channel area of a second conductivity type opposite to said first conductivity type, an insulation layer provided between said source and drain and covering at least said channel area, and a gate electrode of a conductive material provided adjacent to said insulation layer, wherein (1) a first region of the first conductivity type with a low impurity concentration at least adjacent to said channel area and to said source and drain, (2) a second region of the second conductivity type adjacent to said first region, and (3) an additional region of the second conductivity type with an impurity concentration higher than the channel area is provided between said channel area and said first region, are provided, and said first region between said source and drain and said second region is occupied by a depletion region produced by a junction between said first and second regions.

2. A semiconductor device according to claim 1, further comprising:

an additional source of the first conductivity type having an impurity concentration lower than that of said source, provided between said channel area and said source.

3. A semiconductor device according to claim 1, wherein the first conductivity type is n.

4. A semiconductor device according to claim 1, wherein the first conductivity type is p.

5. A semiconductor device according to claim 1, wherein a thickness of said channel area is less than a maximum depletion width extending from said insulating layer side.

6. A semiconductor device according to claim 1, wherein a thickness of said channel area is at least a maximum depletion width extending from said insulating layer side.

7. A semiconductor device according to claim 1, wherein said semiconductor includes mainly at least one element selected from a group comprising silicon, germanium, and gallium arsenide.

8. A semiconductor device according to claim 1, further comprising an additional drain of the first conductivity type having an impurity concentration lower than that of said drain, provided between said channel area and said drain.

9. A semiconductor integrated circuit including a semiconductor device, said semiconductor device comprising:

a semiconductor including at least a source and a drain of a first conductivity type with a high impurity concentration, a channel area of a second conductivity type opposite to said first conductivity type, an insulation layer provided between said source and drain and covering at least said channel area, and a gate electrode of a conductive material provided adjacent to said insulation layer, wherein (1) a first region of the first conductivity type with a low impurity concentration at least adjacent to said channel area and to said source and drain, (2) a second region of the second conductivity type adjacent to said first region, and (3) an additional channel area of the same conductivity type as said channel area with an impurity concentration higher than the channel area is provided between said channel area and said first region, are provided, and said first region between said source and drain and said second region is occupied by a depletion region produced by a junction between said first and second regions.

10. A semiconductor integrated circuit according to claim 9, further comprising:

an additional source of the first conductivity type having an impurity concentration lower than that of said source, provided between said channel area and said source.

11. A semiconductor integrated circuit according to claim 9, further comprising an additional drain of the first conductivity type having an impurity concentration lower than that of said drain, provided between said channel area and said drain.

12. A semiconductor device comprising:

a semiconductor at least provided with a source and a drain of a first conductivity type with a high impurity concentration, a channel region of a second conductivity type opposite to the first conductivity type comprising a first channel area at a surface side and a second channel area including an impurity at a concentration lower than the first channel area;

an insulating layer provided between said source and drain and covering at least said first channel area; and a gate electrode of a conductive material provided adjacent to said insulating layer, wherein a first region of the first conductivity type adjacent to said second channel area is provided, and a depletion region extending from a junction between said second channel area and said first region reaches said source and drain.

13. A semiconductor device according to claim 12, wherein an impurity concentration in said first region is less than that in said source and drain.

14. A semiconductor device acording to claim 12, wherein both of said first and second channel areas are adjacent respectively to said source and drain.

15. A semiconductor device according to claim 12, wherein said first channel area is provided between said source and drain, and said second channel area is provided under said source and drain.

\* \* \* \* \*

UNITED STATES PATENT AND TRADEMARK OFFICE
CERTIFICATE OF CORRECTION

PATENT NO. : 5,583,361

DATED : December 10, 1996

INVENTOR(S) : MASAKAZU MORISHITA

Page 1 of 2

It is certified that error appears in the above-identified patent and that said Letters Patent is hereby corrected as shown below:

On title page, item

[56] REFERENCES CITED

Other Publications, "Confernece" should read --Conference--.

[57] ABSTRACT

Line 2, "conductive" should read --first conductive--.

COLUMN 1

Line 35, "being" should be deleted.
Line 56, "is" should read --is a--.

COLUMN 2

Line 21, "10" should be deleted.

COLUMN 3

Line 28, "Boltz-mann" should read --Boltzmann--.

UNITED STATES PATENT AND TRADEMARK OFFICE
CERTIFICATE OF CORRECTION

PATENT NO. : 5,583,361

DATED : December 10, 1996

INVENTOR(S) : MASAKAZU MORISHITA

Page 2 of 2

It is certified that error appears in the above-identified patent and that said Letters Patent is hereby corrected as shown below:

<u>COLUMN 5</u>

Line 16, "embodiment,a" should read --embodiment, a--.

Signed and Sealed this

Seventeenth Day of June, 1997

Attest:

BRUCE LEHMAN

Attesting Officer

Commissioner of Patents and Trademarks